United States Patent
Yi et al.

(10) Patent No.: US 8,022,432 B2
(45) Date of Patent: Sep. 20, 2011

(54) LIGHT-EMITTING DEVICE COMPRISING CONDUCTIVE NANORODS AS TRANSPARENT ELECTRODES

(75) Inventors: Gyu-chul Yi, Pohang-si (KR); Sung-Jin An, Pohang-si (KR)

(73) Assignee: LG Display Co., Ltd., Seoul (KR)

( * ) Notice: Subject to any disclaimer, the term of this patent is extended or adjusted under 35 U.S.C. 154(b) by 462 days.

(21) Appl. No.: 12/064,235

(22) PCT Filed: Aug. 19, 2005

(86) PCT No.: PCT/KR2005/002748
§ 371 (c)(1),
(2), (4) Date: Aug. 26, 2008

(87) PCT Pub. No.: WO2007/021047
PCT Pub. Date: Feb. 22, 2007

(65) Prior Publication Data
US 2008/0315229 A1 Dec. 25, 2008

(51) Int. Cl.
H01L 29/22 (2006.01)
(52) U.S. Cl. .......... 257/99; 257/79; 257/94; 257/98; 257/103; 257/E33.001; 257/E33.059; 257/E33.064; 977/762
(58) Field of Classification Search .......... 257/79, 257/94, 98, 99, 103, E33.001, E33.059, E33.064; 977/762
See application file for complete search history.

(56) References Cited

U.S. PATENT DOCUMENTS

| 7,045,375 B1* | 5/2006 | Wu et al. ............ 438/35 |
| 7,737,429 B2* | 6/2010 | Kim et al. ............ 257/11 |
| 2005/0199894 A1* | 9/2005 | Rinzler et al. ............ 257/94 |
| 2006/0189018 A1* | 8/2006 | Yi et al. ............ 438/47 |
| 2006/0197436 A1* | 9/2006 | Conley et al. ............ 313/498 |
| 2007/0029561 A1* | 2/2007 | Cho et al. ............ 257/98 |

FOREIGN PATENT DOCUMENTS

JP 06-244457 A 9/1994

OTHER PUBLICATIONS

WIPO, International Search Report for PCT/KR2005/002748.
K. Lee et al., "Single Wall Carbon Nanotubes for p-Type Ohmic Contacts to GaN Light-Emitting Diodes", Nano Letters, Apr. 23, 2004, vol. 4, No. 5, p. 911-914.

* cited by examiner

*Primary Examiner* — Andy Huynh
(74) *Attorney, Agent, or Firm* — Birch, Stewart, Kolasch & Birch, LLP

(57) ABSTRACT

Disclosed herein is an electrical light-emitting device including a transparent conductive nanorod type electrode, in which transparent conductive nanorods grown perpendicular to a light-emitting layer are used as the electrode. Hence, light is not absorbed by the electrode, and tunneling easily occurs due to nanocontact of the nanorods, thus increasing current injection efficiency, and also, total internal reflections decrease. Thereby, the light-emitting device according to this invention has light-emitting properties and luminous efficiency superior to conventional light-emitting devices, including metal electrodes or thin film type transparent electrodes.

8 Claims, 11 Drawing Sheets

LIGHT-EMITTING DEVICE COMPRISING CONDUCTIVE NANORODS AS TRANSPARENT ELECTRODES

CROSS-REFERENCE TO RELATED APPLICATION

This application is a U.S. National Phase application, under 35 U.S.C. §371, of International Application no. PCT/KR2005/002748, with an international filing date of Aug. 19, 2005, which is hereby incorporated by reference for all purposes.

TECHNICAL FIELD

The present invention relates, generally, to light-emitting devices, and, more particularly, to a light-emitting device comprising transparent conductive nanorods as a novel type electrode, to drastically increase light-emitting properties and luminous efficiency.

BACKGROUND ART

As a p-type ohmic electrode of a presently widely available nitride semiconductor light-emitting device, various metal thin films, such as Ni/Au, Pt/Ni/Au, Ni/Pt/Au, Ti/Pt/Au, or Pd/Au, have been thoroughly studied. In particular, an Ni/Au thin film is mainly applied to the p-type electrode of the GaN semiconductor light-emitting device.

However, an ohmic contact of such a metal thin film results in light being absorbed by the semi-transparent metal electrode, thus causing many problems, such as decreased luminous efficiency, thermal stability, and reliability of the device. Moreover, since the p-type GaN thin film has high resistance, when the size of the light-emitting device is increased, current is not uniformly transferred to such a device. Therefore, it is difficult to fabricate a large light-emitting device having high luminance.

To solve the problems, a method of fabricating a device comprising a thin film type transparent electrode is disclosed in the literature "Indium tin oxide contacts to gallium nitride optoelectric devices" (Applied Physics Letters. 74, 3930 (1999)). However, the contact resistance of the light-emitting device increases, and thus, the efficiency of the device decreases.

Although an organic electroluminescent (EL) device is available in addition to the semiconductor light-emitting device, it is also disadvantageous because light emitted from the light-emitting layer does not escape the electrode due to the refractive index (varying with the kinds of material) according to Snell's law, and may be reflected within the light-emitting device or may be absorbed by the metal electrode, thus decreasing the luminous efficiency.

DISCLOSURE

Technical Problem

Accordingly, an object of the present invention is to provide a light-emitting device comprising conductive nanorods as a transparent electrode, which is advantageous because light can be transmitted, total internal reflection can drastically decrease, and simultaneously, current injection is improved, therefore increasing light-emitting properties and luminous efficiency.

Technical Solution

In order to achieve the above object, the present invention provides a light-emitting device, comprising a first conductive semiconductor layer, a light-emitting active layer, and a second conductive semiconductor layer, sequentially laminated on a substrate; a plurality of nanorods, which are grown from a transparent conductive material, formed on the second conductive semiconductor layer; an electrode formed on the plurality of nanorods; and another electrode formed on the first conductive semiconductor layer.

In addition, the present invention provides a light-emitting device, comprising a first conductive semiconductor layer, a light-emitting active layer, and a second conductive semiconductor layer, sequentially laminated on a substrate; a plurality of nanorods, which are grown from a transparent conductive material, formed on the second conductive semiconductor layer; an electrode formed on the plurality of nanorods; and another electrode formed on the second conductive semiconductor layer.

In addition, the present invention provides a light-emitting device, comprising a transparent electrode, a first conductive semiconductor layer, an organic material light-emitting layer, and a second conductive semiconductor layer, sequentially laminated on a substrate; a plurality of nanorods, which are grown from a transparent conductive material, formed on the second conductive semiconductor layer; and an electrode formed on the plurality of nanorods.

In addition, the present invention provides a light-emitting device, comprising a first conductive semiconductor layer, an organic material light-emitting active layer, and a second conductive semiconductor layer, sequentially laminated on a substrate; a plurality of nanorods, which are grown from a transparent conductive material, formed between the substrate and the first conductive semiconductor layer; and an electrode formed on the second conductive semiconductor layer.

Hereinafter, a detailed description will be given of the present invention.

FIG. 1 is a view showing the basic structure of a light-emitting device comprising a conductive nanorod type transparent electrode, according to the present invention.

As shown in FIG. 1, the light-emitting device 10 of the present invention is characterized in that nanorods 20, which are rod type transparent conductive nano-structures grown perpendicular to the light-emitting device 10, are used as an electrode 30 of the light-emitting device 10. In the present invention, the nanorods 20, serving as the electrode layer, may be formed by growing a transparent conductive material perpendicular to the film of the light-emitting device 10 on which an electrode is formed, using a general metal-organic chemical vapor deposition (MOCVD) process.

The nanorod 20 has a diameter ranging from 2 nm to 1 μm, and has a length ranging from 10 nm to 50 μm. When these nanorods are formed using an MOCVD process, they may be formed into various shapes, depending on the amounts of reactive gases supplied, deposition temperatures, and conditions of pressure and temperature.

In the present invention, the nanorods 20 used as the transparent electrode are preferably formed of a material having a transmittance of 70% or more (at a visible light wavelength of 400 nm to 800 nm), for example, ZnO (zinc oxide), ITO (indium tin oxide), GaN (gallium nitride), or a zinc oxide compound, such as $Zn_2SnO_4$, $ZnSnO_3$, $ZnIn_2O_5$, $ZnO$—$In_2O_3$, $Zn_2In_2O_5$—$In_4Sn_3O_{12}$, or $MgIn_2O_4$—$Zn_2InO_5$.

In addition, with the goal of increasing the electrical and optical properties of the electrode 30 of the light-emitting device, the nanorods 20 may be coated with various organic or inorganic materials, for example, various heterogeneous materials, such as any one selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, Sn, H, and mixtures thereof, nitrides such as AlN, InN, GaInN, AlGaN, or AlInN, oxides such as ZnMgO, Al$_2$O$_3$, or MgO, etc.

Further, the nanorods 20, which are formed using MOCVD, include a transparent material (e.g., a photoresist) loaded into the gaps therebetween so that the upper surfaces of the nanorods 20 or the upper tips of the nanorods 20 are exposed. In addition, the nanorods 20 undergo a post-treatment process, such as doping treatment, plasma treatment, or annealing treatment, using H$_2$, O$_2$, N$_2$, NH$_3$, silane, etc., to increase the conductivity. Thereby, the nanorods may be used as the electrode layer of the light-emitting device in the various wavelength regions, including visible light, infrared rays or ultraviolet rays.

The transparent conductive nanorod type electrode of the present invention may be employed for light-emitting devices having various structures shown in FIGS. 2 to 7 (e.g., light-emitting diodes (LEDs), laser diodes, or organic light-emitting devices). The electrode layer of the light-emitting device of the present invention may further include a metal electrode and/or a transparent thin film electrode, in addition to the transparent conductive nanorods.

Hence, as in the light-emitting device of the present invention, when the transparent electrode is formed not into the thin film but into the rod type nano-structure, total internal reflections decrease and internal light may easily escape, resulting in increased luminous efficiency. In addition, due to the high aspect ratio and nano-sized contact area of the nanorods, tunneling may easily occur, and current injection increases. Therefore, even if the light-emitting device is enlarged, the current may be uniformly transferred, and thus, it is possible to fabricate a large light-emitting device having high luminance.

FIGS. 2 and 3 are longitudinal sectional views showing the structures of a light-emitting device comprising a conductive nanorod type transparent electrode, according to a first embodiment of the present invention.

As shown in FIG. 2, a P-N junction light-emitting diode, according to the first embodiment of the present invention, is composed of a substrate 100, a first conductive (n-type) semiconductor layer 102, a light-emitting active layer 104, and a second conductive (p-type) semiconductor layer 106, each of which is sequentially laminated. In addition, a plurality of nanorods 108, which are grown from a transparent conductive material, are formed on the p-type semiconductor layer 106. In addition, a transparent or opaque metal electrode 110 is laminated on the plurality of nanorods 108. Further, the active layer 104 and the p-type semiconductor layer 106 are patterned together, and thus, part of the upper surface of the n-type semiconductor layer 102 is exposed, to form another transparent or opaque metal electrode 112 on the exposed upper surface thereof.

In the light-emitting device according to the first embodiment of the present invention, since a nitride semiconductor (e.g., p-GaN) acting as the p-type semiconductor layer has high resistance, current injection becomes difficult. Hence, to improve the current injection, the transparent conductive nanorods 108 are provided on the p-type semiconductor layer 106.

Turning now to FIG. 3, a P-N junction light-emitting diode, according to a modification of the first embodiment of the present invention, comprises a substrate 100, an n-type semiconductor layer 102, a light-emitting active layer 104, and a p-type semiconductor layer 106, each of which is sequentially laminated. In addition, a plurality of nanorods 108, which are grown from a transparent conductive material, are formed on the p-type semiconductor layer 106. A transparent or opaque metal electrode 110 is laminated on the plurality of nanorods.

As shown in FIG. 3, when the p-type nanorod 108 type transparent electrode is used, current injection becomes easier. Thus, the transparent nanorods 108 are formed on the p-type semiconductor layer 106 and another metal electrode 112 is also formed on the p-type semiconductor layer 106 to be spaced apart from the nanorods by a predetermined interval, without the need for an etching process for patterning the active layer 104 and the p-type semiconductor layer 106 together, as in FIG. 2. Therefore, according to the modification of the first embodiment of the present invention, the metal electrodes 110 and 112 may be deposited and patterned immediately after the transparent conductive nanorods 108 are grown perpendicular to the upper surface of the p-type semiconductor layer 106, without the etching process.

In this way, the light-emitting device shown in FIGS. 2 and 3, according to the first embodiment of the present invention, is a diode emitting light in the visible region, the infrared region, or the ultraviolet region, and is composed of a nitride semiconductor, such as GaN, a III-V group compound semiconductor, such as GaAs, or InP, an oxide semiconductor, such as ZnO, CdO, MgO, or Al$_2$O$_3$, and alloys thereof.

According to the first embodiment of the present invention, the nanorods 108 are formed in a manner such that a transparent conductive material is grown perpendicular to the upper surface of the p-type semiconductor layer 106 using MOCVD. As such, the nanorod thus formed has a diameter ranging from 2 nm to 1 μm, and has a length ranging from 10 nm to 50 μm.

In addition, the nanorods 108 used as the transparent electrode are preferably formed of a material having a transmittance of 70% or more (at a visible light wavelength of 400 nm to 800 nm), for example, ZnO, ITO, GaN, or a zinc oxide compound, such as Zn$_2$SnO$_4$, ZnSnO$_3$, ZnIn$_2$O$_5$, ZnO—In$_2$O$_3$, Zn$_2$In$_2$O$_5$—In$_4$Sn$_3$O$_{12}$, or MgIn$_2$O$_4$—Zn$_2$InO$_5$.

In addition, to improve the electrical and optical properties of the electrode 110, the nanorods 108 may be coated with various organic or inorganic materials, for example, various heterogeneous materials, such as any one selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, Sn, H, and mixtures thereof, nitrides such as AlN, InN, GaInN, AlGaN, or AlInN, oxides such as ZnMgO, Al$_2$O$_3$, or MgO, etc.

Moreover, the nanorods 108 include a transparent material (e.g., a photoresist) loaded into the gaps therebetween, so that the upper surfaces of the nanorods 108 or the upper tips of the nanorods 108 are exposed. Further, the nanorods 108 may be subjected to a post-treatment process, such as doping treatment, plasma treatment, or annealing treatment, using H$_2$, O$_2$, N$_2$, NH$_3$, silane, etc., to increase the conductivity.

FIGS. 4 and 5 are longitudinal sectional views showing the structures of a light-emitting device comprising a conductive nanorod type transparent electrode, according to a second embodiment of the present invention.

As shown in FIG. 4, a light-emitting device, according to the second embodiment of the present invention, comprises a substrate 200, a first conductive (n-type) semiconductor layer 202, a light-emitting active layer 204, and a second conductive (p-type) semiconductor layer 206, each of which is sequentially laminated. In addition, a plurality of nanorods 208, which are grown from a transparent conductive material, are formed on the p-type semiconductor layer 206. Also, a transparent electrode 210 is formed on the transparent conductive nanorods 208, and a transparent or opaque metal electrode 212 is laminated on the electrode 210. Further, the active layer 204 and the p-type semiconductor layer 206 are patterned together, and thus, part of the upper surface of the n-type semiconductor layer 202 is exposed, to form another transparent or opaque metal electrode 214 on the exposed upper surface thereof.

As shown in FIG. 5, a light-emitting device, according to a modification of the second embodiment of the present invention, comprises a substrate 200, an n-type semiconductor layer 202, a light-emitting active layer 204, and a p-type semiconductor layer 206, each of which is sequentially laminated. In addition, a plurality of nanorods 208, which are grown from a transparent conductive material, are formed on the p-type semiconductor layer 206. Further, a transparent electrode 210 is formed on the transparent conductive nanorods 208, and a transparent or opaque metal electrode 212 is laminated on the electrode 210.

According to the modification of the second embodiment of the present invention shown in FIG. 5, the current injection becomes easier thanks to the p-type nanorods 208. Hence, the transparent conductive nanorods 208 are formed on the p-type semiconductor layer 206 and another metal electrode 214 is also formed on the p-type semiconductor layer 206 to be spaced apart from the transparent conductive nanorods 208 by a predetermined interval, without the need for an etching process for patterning the active layer 204 and the p-type semiconductor layer 206 together, as in FIG. 4.

In this way, the light-emitting device shown in FIGS. 4 and 5, according to the second embodiment of the present invention, is a diode emitting light in the visible region, the infrared region, or the ultraviolet region, and is composed of a nitride semiconductor, such as GaN, a III-V group compound semiconductor, such as GaAs, or InP, an oxide semiconductor, such as ZnO, CdO, MgO, or $Al_2O_3$, and alloys thereof.

According to the second embodiment of the present invention, the nanorods 208 are formed in a manner such that the transparent conductive material is grown perpendicular to the upper surface of the p-type semiconductor layer 206 using MOCVD. As such, the nanorod thus formed has a diameter ranging from 2 nm to 1 µm, and has a length ranging from 10 nm to 50 µm.

Also, the nanorods 208 used as the transparent electrode are preferably formed of a material having a transmittance of 70% or more (at a visible light wavelength of 400 to 800 nm), for example, ZnO, ITO, GaN, or a zinc oxide compound, such as $Zn_2SnO_4$, $ZnSnO_3$, $ZnIn_2O_5$, $ZnO$—$In_2O_3$, $Zn_2In_2O_5$—$In_4Sn_3O_{12}$, or $MgIn_2O_4$—$Zn_2InO_5$.

In addition, to improve the electrical and optical properties of the electrode 212, the nanorods 208 may be coated with various organic or inorganic materials, for example, various heterogeneous materials, such as any one selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, Sn, H, and mixtures thereof, nitrides such as AlN, InN, GaInN, AlGaN, or AlInN, oxides such as ZnMgO, $Al_2O_3$, or MgO, etc.

According to the second embodiment of the present invention, the nanorods 208 include a transparent material (e.g., a photoresist) loaded into the gaps therebetween, so that the upper surfaces of the nanorods 208 or the upper tips of the nanorods 208 are exposed. In addition, the nanorods 208 are subjected to a post-treatment process, such as doping treatment, plasma treatment, or annealing treatment, using $H_2$, $O_2$, $N_2$, $NH_3$, silane, etc., to increase the conductivity.

FIGS. 6 and 7 are longitudinal sectional views showing the structures of a light-emitting device comprising a conductive nanorod type transparent electrode, according to a third embodiment of the present invention.

As shown in FIG. 6, a light-emitting device, according to the third embodiment of the present invention, comprises a transparent substrate 300 (e.g., glass), a transparent electrode 302 formed of ITO or ZnO, a hole-transporting layer 304 doped with a p-type dopant, a light-emitting layer 306, and an electron-transporting layer 308 doped with an n-type dopant, each of which is sequentially laminated. In addition, a plurality of nanorods 310, which are grown from a transparent conductive material, are formed as an electron-injecting layer on the electron-transporting layer 308. A metal electrode 312 is laminated on the plurality of nanorods.

As shown in FIG. 7, a light-emitting device, according to a modification of the third embodiment of the present invention, comprises a plurality of nanorods 320 formed as a hole-injecting layer on a transparent substrate 300 (e.g., glass) by growing a transparent conductive material thereon. On the nanorods 320, a hole-transporting layer 322 doped with a p-type dopant, a light-emitting layer 324, an electron-transporting layer 326 doped with an n-type dopant, and an electron-injecting layer 328 doped with an n-type dopant, are sequentially laminated. In addition, a transparent electrode 330 is laminated on the electron-injecting layer 328.

In this way, the light-emitting device shown in FIGS. 6 and 7, according to the third embodiment of the present invention, is a diode emitting light in the visible region, and is composed of a nitride semiconductor, such as GaN, a III-V group compound semiconductor, such as GaAs or InP, an oxide semiconductor, such as ZnO, CdO, MgO or $Al_2O_3$, and alloys thereof; and $Alq_3$, $Zn(PhPy)_2$, LiPBO, $Zn(Phq)_2$, $Zn(BOX)_2$, $Be(bq)_2$, $Zn(BTZ)_2$, $Zn(ODZ)_2$, BAlq, $Zn(TDZ)_2$, $Be(5Fla)_2$, $Zn(DIZ)_2$, etc.

The nanorods 310 or 320, according to the third embodiment of the present invention, are formed in a manner such that a transparent conductive material is grown perpendicular to the upper surface of the electron-transporting layer 308 or the substrate, using MOCVD. As such, the nanorod has a diameter ranging from 2 nm to 1 µm, and has a length ranging from 10 nm to 50 µm.

In addition, the nanorods 310 or 320, acting as the transparent electrode, are preferably formed of a material having a transmittance of 70% or more (at a visible light wavelength of 400 to 800 nm), for example, ZnO, ITO, GaN, or a zinc oxide compound, such as $Zn_2SnO_4$, $ZnSnO_3$, $ZnIn_2O_5$, $ZnO$—$In_2O_3$, $Zn_2In_2O_5$—$In_4Sn_3O_{12}$, or $MgIn_2O_4$—$Zn_2InO_5$.

According to the third embodiment of the present invention, to improve the electrical and optical properties of the electrode 312 or 330, the nanorods 310 or 320 may be coated with various organic or inorganic materials, for example, various heterogeneous materials, such as any one selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, Sn, H, and mixtures thereof, nitrides, such as AlN, InN, GaInN, AlGaN, or AlInN, oxides, such as ZnMgO, $Al_2O_3$, or MgO, etc.

Further, the nanorods 310 or 320 include a transparent material (e.g., a photoresist) loaded into the gaps therebetween, so that the upper surfaces of the nanorods or the upper tips of the nanorods are exposed. In addition, the nanorods 310 or 320 are subjected to a post-treatment process, such as doping treatment, plasma treatment, or annealing treatment, using $H_2$, $O_2$, $N_2$, $NH_3$, silane, etc., to increase the conductivity.

Therefore, the organic light-emitting device of the present invention is advantageous because the plurality of nanorods 310 or 320 formed by growing the transparent conductive material are provided as the electron-injecting layer or hole-injecting layer, and thus, current injection or hole injection becomes easier.

INDUSTRIAL APPLICABILITY

As described hereinbefore, the present invention provides a light-emitting device comprising conductive nanorods as a transparent electrode. In the light-emitting device comprising conductive nanorods as a transparent electrode according to the present invention, light is not absorbed by the electrode, and total internal reflections decrease. Also, current injection increases due to the nanocontact of the nanorods, and thus, the efficiency of the device is not reduced even if the device is enlarged. Thereby, a large light-emitting device having high luminance and high efficiency can be fabricated.

Further, when the transparent conductive nanorods are applied to a nitride semiconductor light-emitting diode, a dry etching process for forming a metal electrode on the nanorods and then etching an n-type semiconductor layer to form another metal electrode is not needed, and the metal electrode can be directly formed on the p-type semiconductor layer, thus simplifying the processes of fabricating the light-emitting device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

BEST MODE FOR INVENTION

Hereinafter, the present invention is specifically explained using the following examples, which are set forth to illustrate, but are not to be construed to limit the present invention.

Example 1

Figure 1:
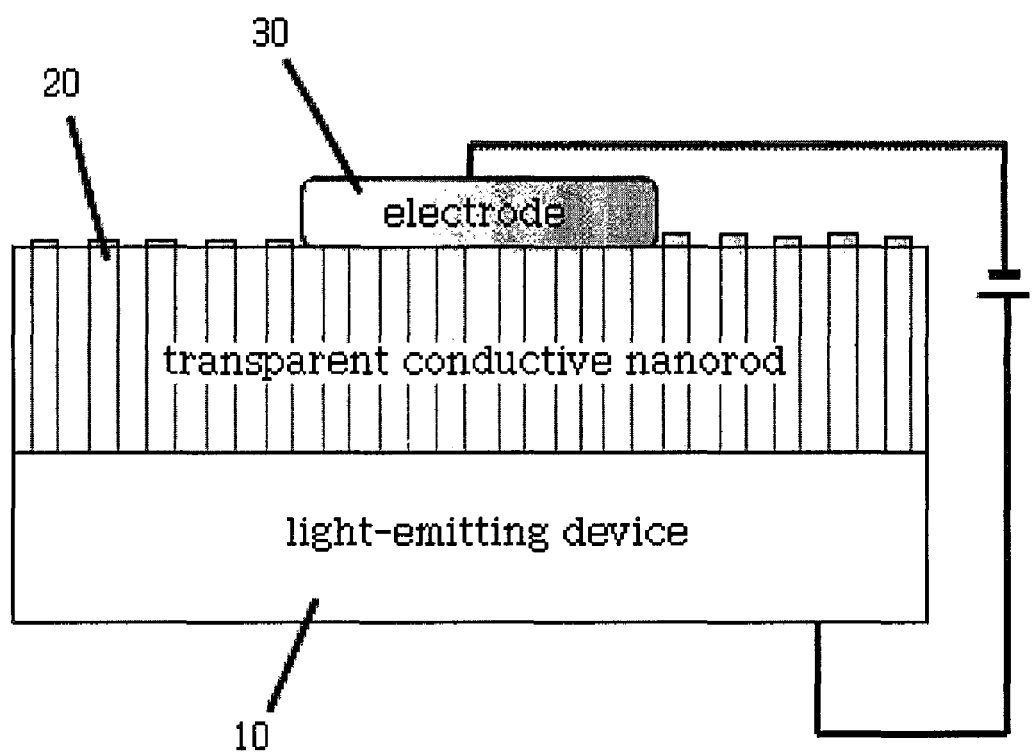
FIG. 1 is a view showing the basic structure of a light-emitting device comprising a conductive nanorod type transparent electrode, according to the present invention.
Figure 2:
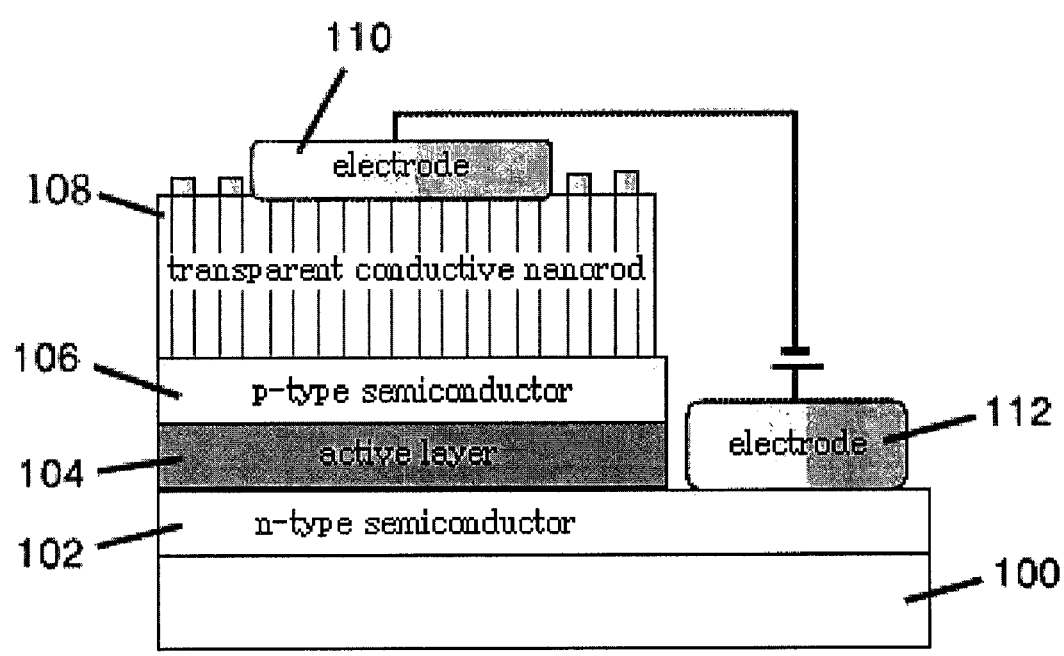
FIGS. 2 and 3 are longitudinal sectional views showing the structures of a light-emitting device comprising a conductive nanorod type transparent electrode, according to a first embodiment of the present invention.
Figure 3:
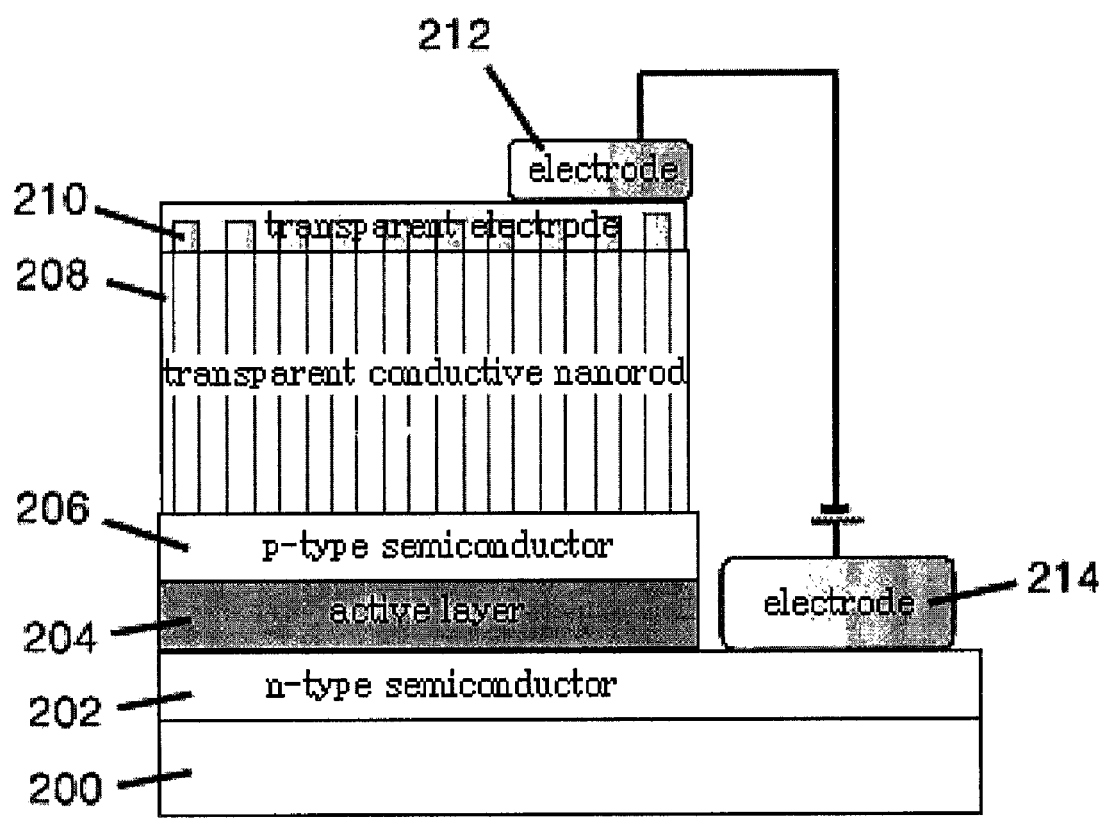
Figure 4:
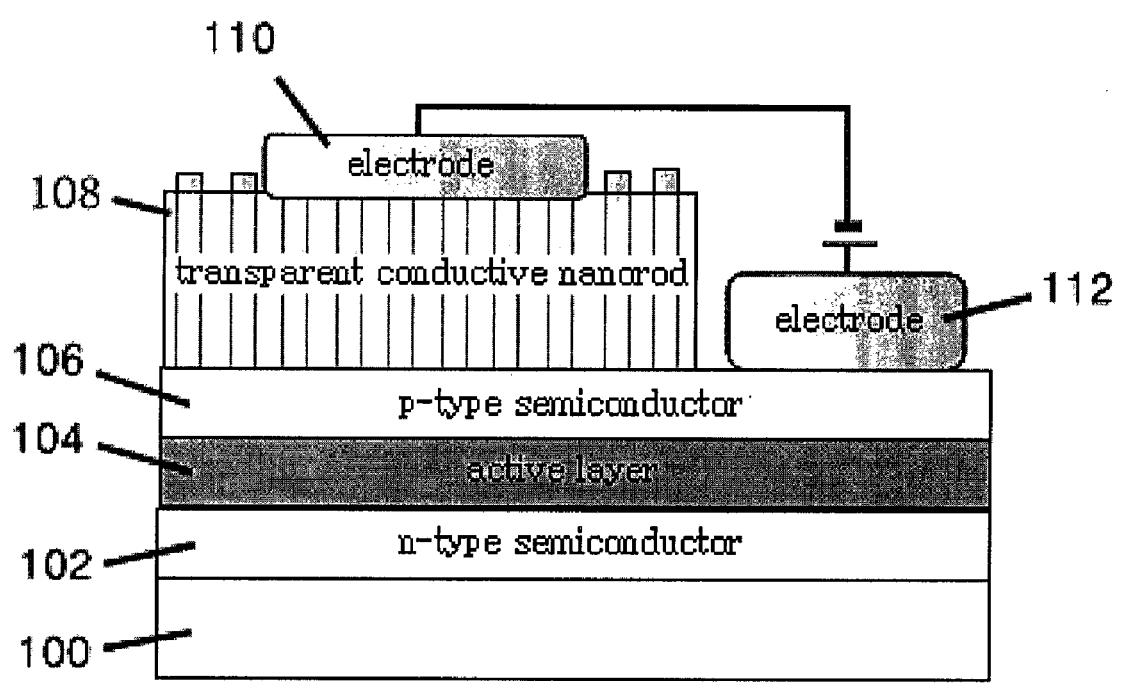
FIGS. 4 and 5 are longitudinal sectional views showing the structures of a light-emitting device comprising a conductive nanorod type transparent electrode, according to a second embodiment of the present invention.
Figure 5:
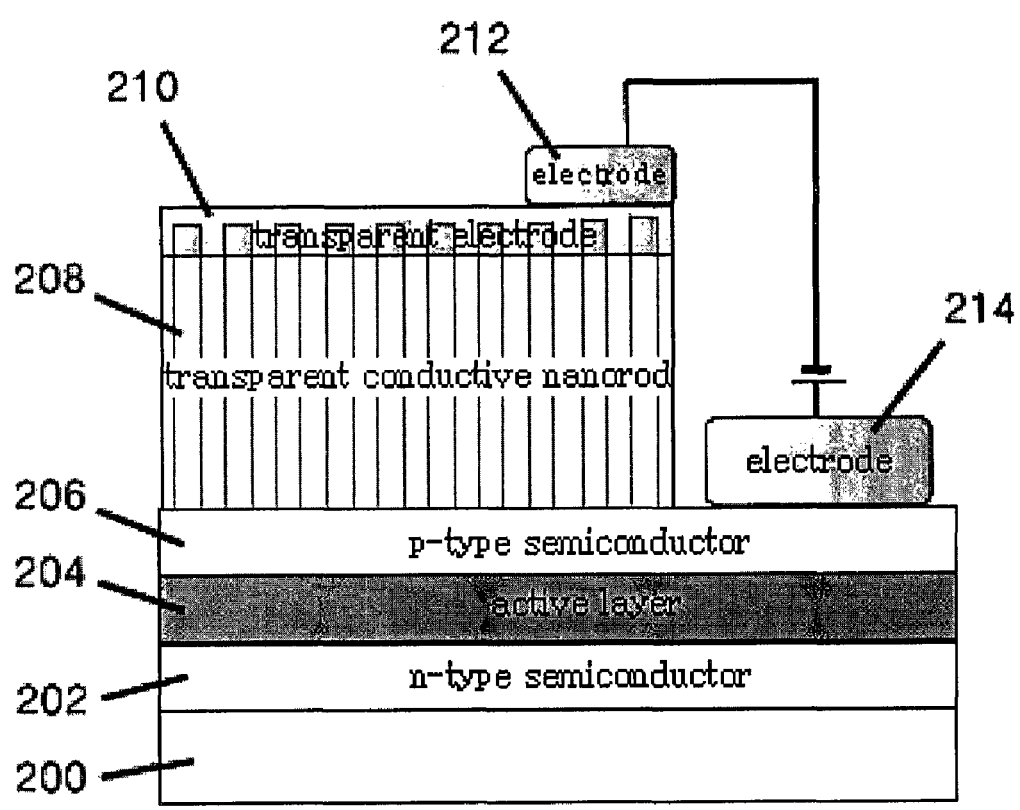
Figure 6:
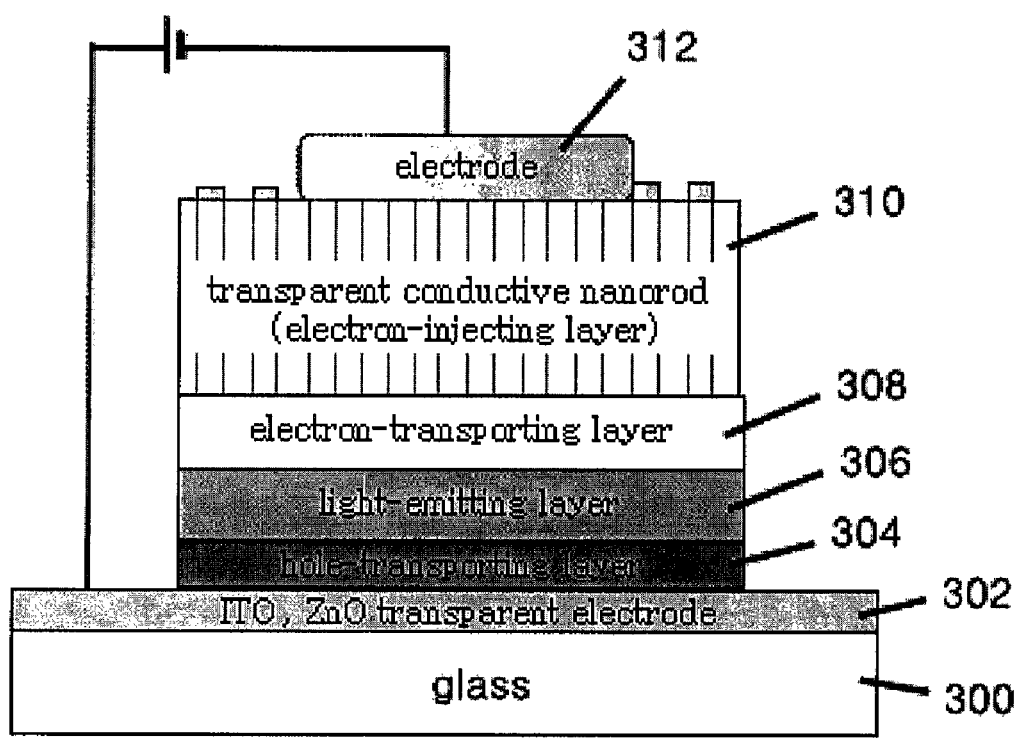
FIGS. 6 and 7 are longitudinal sectional views showing the structures of a light-emitting device comprising a conductive nanorod type transparent electrode, according to a third embodiment of the present invention.
Figure 7:
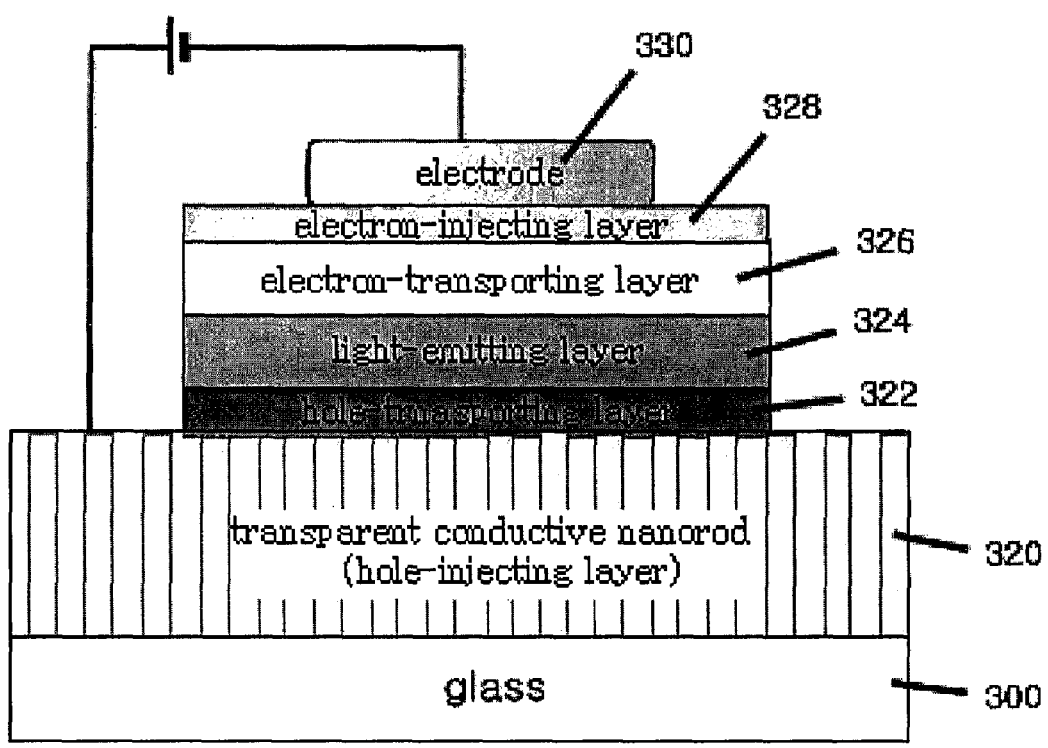

Fabrication of Light-Emitting Device Including Zinc Oxide (ZnO) Nanorod Type Transparent Electrode To fabricate the nitride semiconductor light-emitting device shown in FIG. 3, a GaN thin film was grown to a thickness of 1 μm on an $Al_2O_3$ substrate using an MOCVD apparatus, and an n-type GaN thin film doped with silicon (Si), acting as an n-type semiconductor layer, was grown to a thickness of 2 μm. On the n-type semiconductor layer, a light-emitting layer having a five-layered InGaN quantum well structure was grown. As such, the layer thickness of the InGaN quantum well, the wall thickness of the well, and the composition ratio of $In_xGa_{1-x}N$ (0<x<1) were different from each other, to control the color of light emitted. For example, the light-emitting layer was composed of an Si-doped $In_{0.04}Ga_{0.96}N$ well having a layer thickness of 5 nm, and a non-doped $In_{0.14}Ga_{0.86}N$ well having a wall thickness of 3.5 nm. Then, on the InGaN light-emitting layer, a 0.3 μm thick p-type GaN thin film doped with Mg was grown as the p-type semiconductor layer, thus fabricating a nitride semiconductor light-emitting diode. In this case, as the reactive precursors containing organic metal, trimethylgallium (TMGa), silane, trimethylindium (TMIn), and biscyclopentadienyl magnesium $((C_5H_5)_2Mg)$ could be used, and $NH_3$ was used as the nitrogen-containing precursor.

On the thin film of the nitride light-emitting diode thus grown, zinc oxide (ZnO) was grown perpendicular to the upper surface of the p-type GaN thin film using an MOCVD apparatus in the absence of a metal catalyst, to form ZnO nanorods. As such, as the reactive materials, diethyl zinc and $O_2$ were used, and argon (Ar) was used as a carrier gas. The precursors of the reactive materials were allowed to chemically react in the reactor, whereby the ZnO nanorods were deposited on the nitride semiconductor thin film. During the growth of the nanorods for about 1 hr, the reactor was maintained at 400-800° C. under pressure of 0.1-5 Torr.

Subsequently, the grown ZnO nanorods were coated with a photoresist serving as a transparent insulator, and thus, the gaps between the nanorods were filled with an insulating material. After the coating, the nanorods were etched using an oxygen ($O_2$) plasma treatment, whereby about 30 nm of the tips of the nanorods were exposed.

On the tips of the nanorods thus exposed, titanium (Ti) and gold (Au) were sequentially deposited to thicknesses of about 10 nm and 50 nm, respectively, using heat or an electron beam evaporation process, and then patterned, to form a metal electrode. As in FIG. 3, platinum (Pt) and gold (Au) were sequentially deposited to about 10 nm and 50 nm, respectively, on the p-type GaN thin film, and were then patterned, to form another electrode. At this time, the accelerating voltage and emission current of the electron beams for metal evaporation were determined to be 4 KV –20 KV and 40 mA –400 mA, respectively. Upon metal deposition, the pressure of the reactor was about $10^{-5}$ mmHg, and the temperature of the substrate was maintained at room temperature.

Example 2

Fabrication of Light-Emitting Device Comprising Multiwall (Shell/Core) Gallium Nitride/Zinc Oxide (GaN/ZnO) Nanorod Type Transparent Electrode A light-emitting device comprising multiwall (shell/core) gallium nitride (GaN)/zinc oxide (ZnO) nanorods as a transparent electrode was fabricated in the same manner as in Example 1, with the exception that zinc oxide nanorods grown in Example 1 were further coated with gallium nitride (GaN). To coat the nanorods with gallium nitride, TMGa and $NH_3$ gases were supplied to a reactor in which the ZnO nanorods grown on the nitride thin film were placed. While the reactor was maintained at 100 Torr and 500° C., the reactive precursors were allowed to chemically react for 5 min in the reactor, thereby forming multiwall (shell/core) gallium nitride/zinc oxide nanorods composed of the zinc oxide nanorods coated with gallium nitride (GaN).

Figure 8:
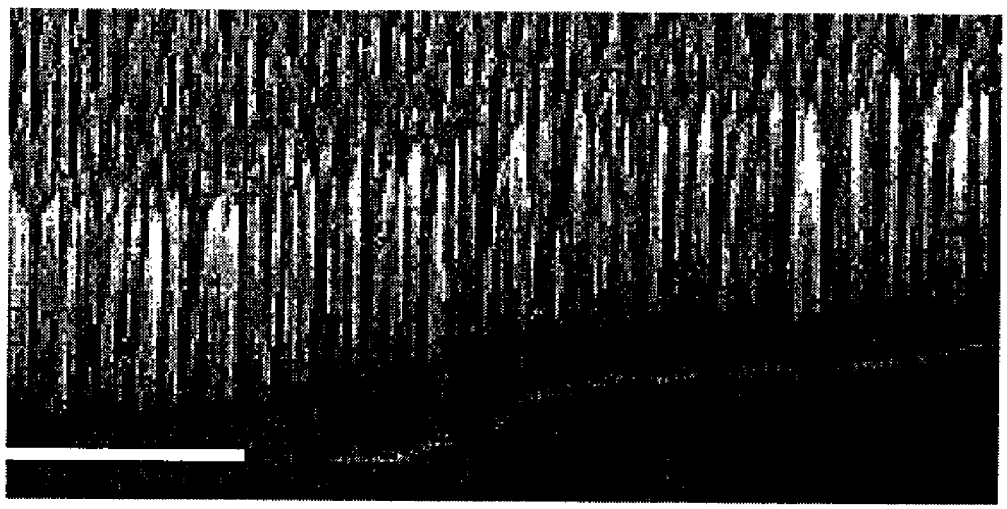
FIGS. 8 to 10 are scanning electron microscopic (SEM) images showing the nitride semiconductor light-emitting device comprising a multiwall (shell/core) GaN/ZnO nanorod type transparent electrode, fabricated in Example 2 of the present invention.
Figure 9:
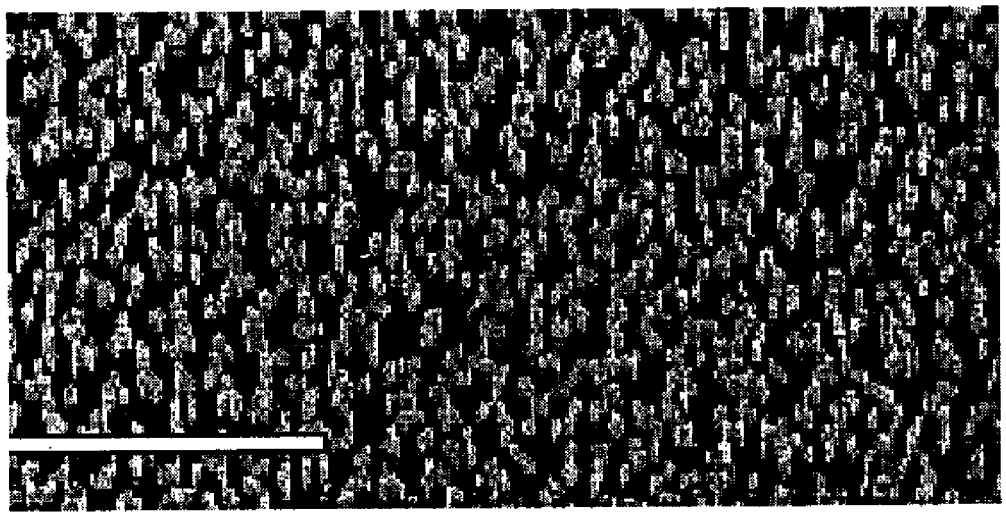

FIGS. 8 to 9 are SEM images showing the nitride semiconductor light-emitting device comprising multiwall (shell/core) GaN/ZnO nanorods as a transparent electrode, fabricated in Example 2, in which the sections of the electrodes of the light-emitting device, including the zinc oxide (ZnO) nanorods grown perpendicular to the thin film thereof, and also the metal thin films deposited on the tips of the nanorods, are observed using a scanning electron microscope.

Figure 10:
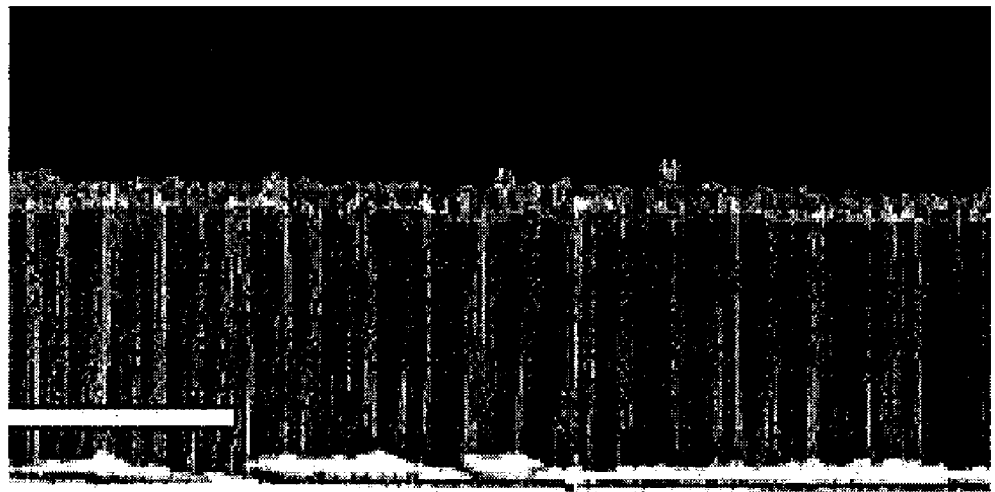

FIG. 8 is an SEM image showing the GaN/ZnO multiwall nanorods grown on the nitride light-emitting device. FIG. 9 is an SEM image showing the nanorods, in which a photoresist serving as an insulator is loaded into gaps between the nanorods and then the tips of the nanorods are exposed through the oxygen plasma treatment. FIG. 10 is an SEM image showing the section of the nanorods and the metal thin film deposited on the tips of the nanorods.

Figure 11:
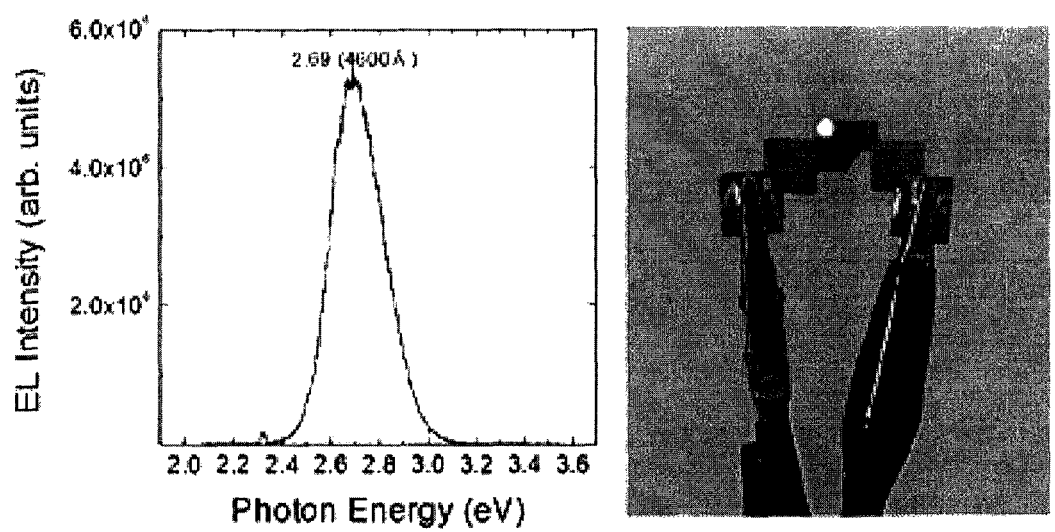
FIG. 11 is an emission spectrum of the nitride semiconductor light-emitting device comprising a multiwall GaN/ZnO nanorod type transparent electrode, fabricated in Example 2 of the present invention.

In addition, an emission spectrum of the nitride semiconductor light-emitting diode comprising the transparent conductive nanorods as the electrode, fabricated in Example 2 of the present invention, is measured at room temperature, the result of which is shown in FIG. 11. The photoemission of the light-emitting diode was very strong so that it could be confirmed with the naked eye. From the result of the emission spectrum, it can be seen that the fabricated device emits light in the blue-light wavelength range.

The invention claimed is:

1. A light-emitting device, comprising:
   a first conductive semiconductor layer, a light-emitting active layer, and a second conductive semiconductor layer, each of which is sequentially laminated on a substrate;
   a plurality of nanorods, grown from a transparent conductive material, formed on the second conductive semiconductor layer;
   an electrode formed on the plurality of nanorods; and
   another electrode formed on the first conductive semiconductor layer,
   wherein each of the plurality of nanorods comprises a transparent material loaded into gaps between the nanorods to expose upper surfaces of the nanorods or upper tips thereof.

2. The light-emitting device according to claim 1, further comprising a transparent electrode provided between the plurality of nanorods and the electrode formed on the plurality of nanorods.

3. The light-emitting device according to any one of claim 1 or 2, wherein each of the plurality of nanorods has a diameter ranging from 2 nm to 1 μm, and has a length ranging from 10 nm to 50 μm.

4. The light-emitting device according to any one of claim 1 or 2, wherein each of the plurality of nanorods is fomed of a material having a transmittance of 70% or more at a visible light wavelength ranging from 400 nm to 800 nm.

5. The light-emitting device according to any one of claim 1 or 2, wherein each of the plurality of nanorods is fomed of any one selected from the group consisting of ZnO (zinc oxide), ITO (indium tin oxide), GaN (gallium nitride), and mixtures thereof.

6. The light-emitting device according to any one of claim 1 or 2, wherein each of the plurality of nanorods is further doped with any one heterogeneous material selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, Sn, H, and mixtures thereof.

7. The light-emitting device according to any one of claim 1 or 2, wherein each of the plurality of nanorods is fomed of any one selected from the group consisting of $Zn_2SnO_4$, $ZnSnO_3$, $ZnIn_2O_5$, $ZnO$—$In_2O_3$, $Zn_2In_2O_5$—$In_4Sn_3O_{12}$, and $MgIn_2O_4$—$Zn_2InO_5$.

8. The light-emitting device according to any one of claim 1 or 2, wherein each of the plurality of nanorods is further coated with any one heterogeneous material selected from the group consisting of AlN, InN, GaInN, AlaN, AlInN, ZnMgO, $Al_2O_3$, MgO, and mixtures thereof.

* * * * *